(12) United States Patent
Hu (10) Patent No.: US 7,042,728 B2
(45) Date of Patent: May 9, 2006

(54) CLAMPING STRUCTURE AND HEAT DISSIPATING MODULE USING SAME

(75) Inventor: Jun-Liang Hu, Dongguan (CN)

(73) Assignee: Molex Incorporated, Lisle, IL (US)

( * ) Notice: Subject to any disclaimer, the term of this patent is extended or adjusted under 35 U.S.C. 154(b) by 44 days.

(21) Appl. No.: 10/869,146

(22) Filed: Jun. 16, 2004

(65) Prior Publication Data

US 2004/0257770 A1    Dec. 23, 2004

(30) Foreign Application Priority Data

Jun. 17, 2003  (CN) ............................... 92 2 11039
Jun. 17, 2003  (CN) ............................... 92 2 11051

(51) Int. Cl.
*H05K 7/20* (2006.01)

(52) U.S. Cl. ..................... 361/704; 257/718; 257/719; 257/727; 174/16.3; 165/80.3; 165/185; 24/505; 24/510

(58) Field of Classification Search ................ 361/704, 361/695, 707, 709; 257/718–719, 722, 727; 174/16.1, 16.3; 165/80.3, 185; 24/457, 24/458
See application file for complete search history.

(56) References Cited

U.S. PATENT DOCUMENTS

| 6,449,152 | B1 * | 9/2002 | Lin ............................ 361/697 |
| 6,450,248 | B1 * | 9/2002 | Chang ........................ 165/80.3 |
| 6,662,412 | B1 * | 12/2003 | Chuang et al. ............... 24/457 |
| 6,731,504 | B1 * | 5/2004 | Liu ............................ 361/704 |
| 6,822,864 | B1 * | 11/2004 | Huang et al. ............... 361/697 |

* cited by examiner

*Primary Examiner*—Boris Chervinsky
(74) *Attorney, Agent, or Firm*—Stephen Z. Weiss (57) ABSTRACT

A clamping structure is used to fix a heat-dissipating body on a chip module. The clamping structure comprises a clamping body, two clamping portions, a pivot element, a top frame and a bottom frame. The two clamping portions are respectively connected to two sides of the clamping body and are clamped to the bottom frame. The pivot element is pivotally connected to the clamping body and has a movable portion and an ear piece. The ear piece has a fixed portion and a release portion respectively formed at an end side thereof for fixing and releasing the heat-dissipating body. The clamping structure is used to eliminate a spare gap between the clamping element and the top frame, and clamping element and the bottom frame without using the elastic element. The clamping structure can also be used with a heat sink to form a heat-dissipating module.

12 Claims, 10 Drawing Sheets

CLAMPING STRUCTURE AND HEAT DISSIPATING MODULE USING SAME

FIELD OF THE INVENTION

The present invention relates to a clamping structure, and especially to a clamping structure for retaining a heat-dissipating body on a chip module without using an elastic element, and a heat-dissipating module using such clamping structure.

BACKGROUND OF THE INVENTION

According to the development of the computer industry, the heat-generating quantity in the chip module is increasing and the size of the chip module is being reduced. In order to dissipate the dense heat out of the system and retain the chip module within its normal operating temperature, a heat-dissipating body is used with a larger area to contact with a surface of the chip module for dissipating the heat and increasing the life of the chip module.

Figure 1:
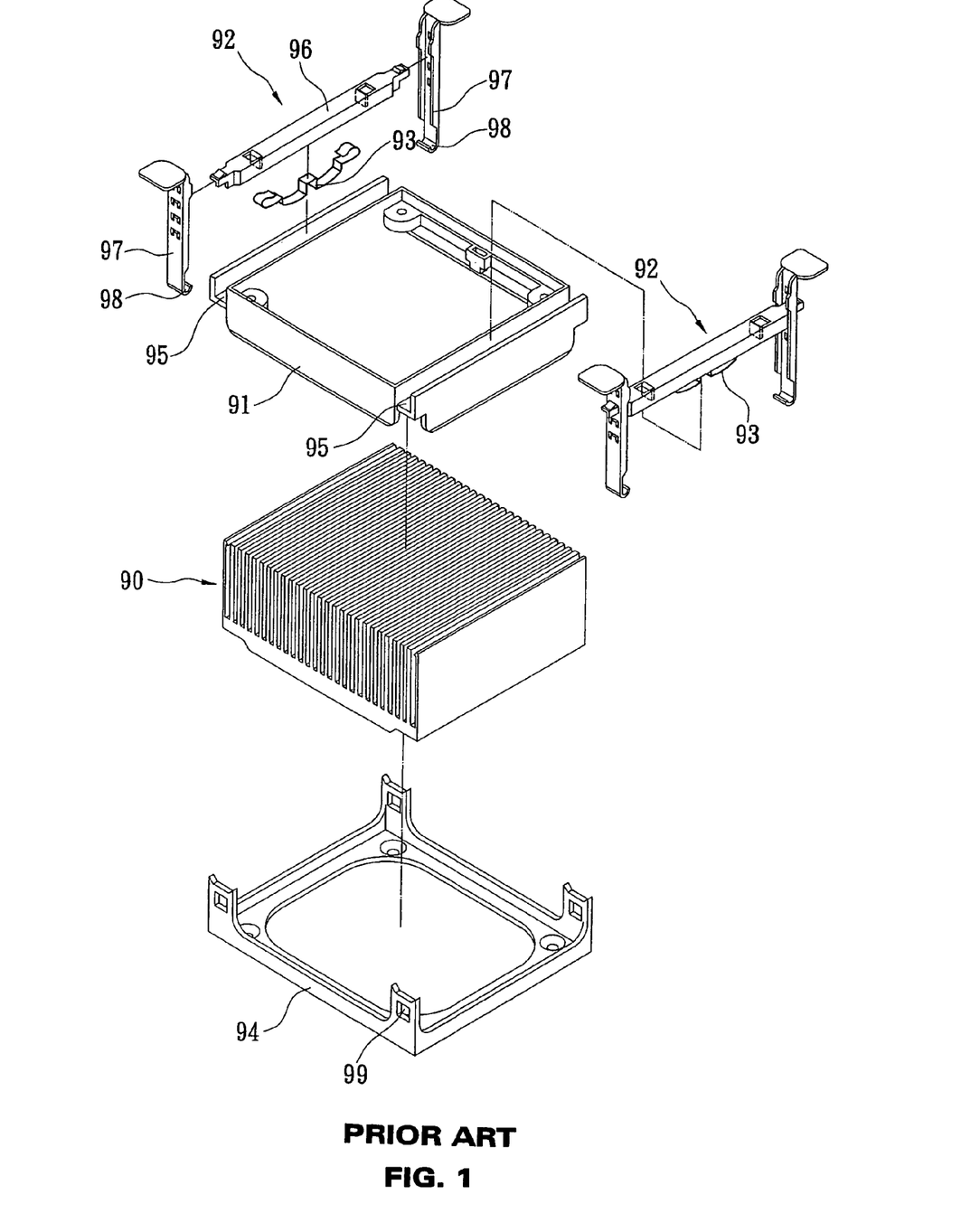
FIG. 1 is a perspective view of the heat-dissipating module of the prior art.
Figure 2:
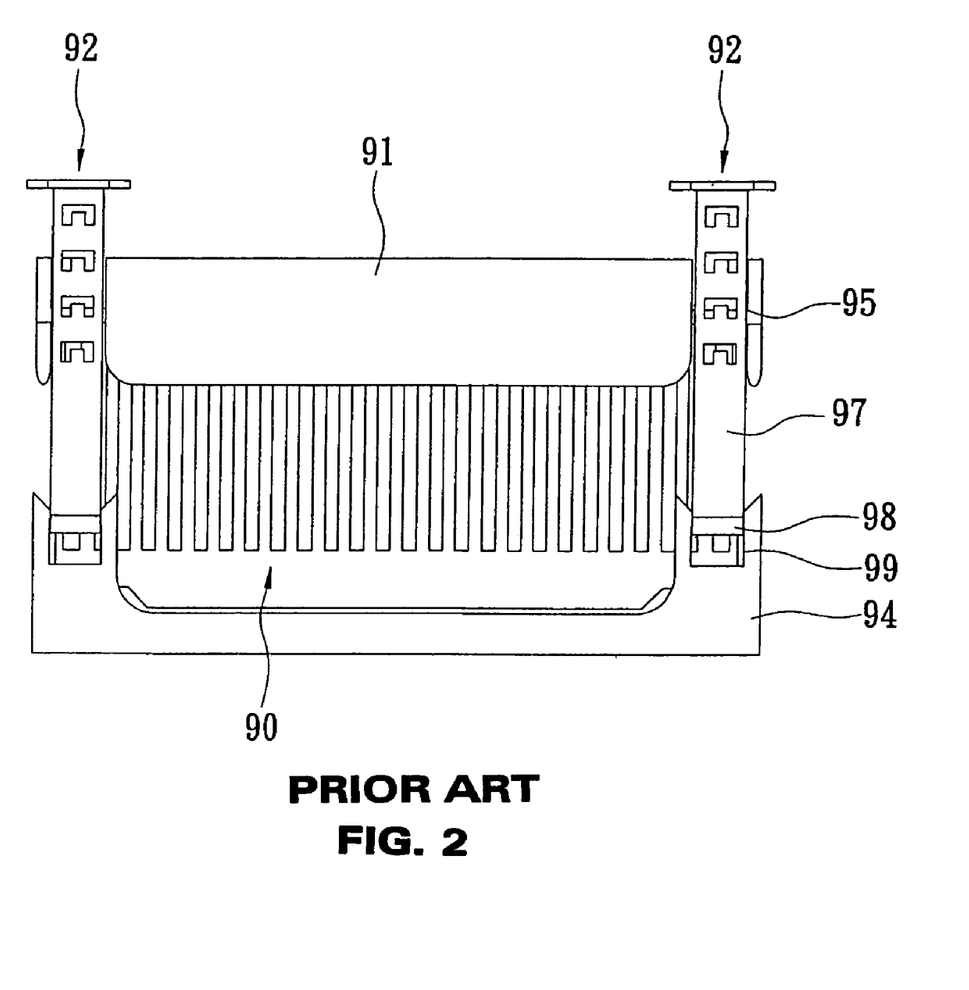
FIG. 2 is a side view of the heat-dissipating module of the prior art.
Figure 3:
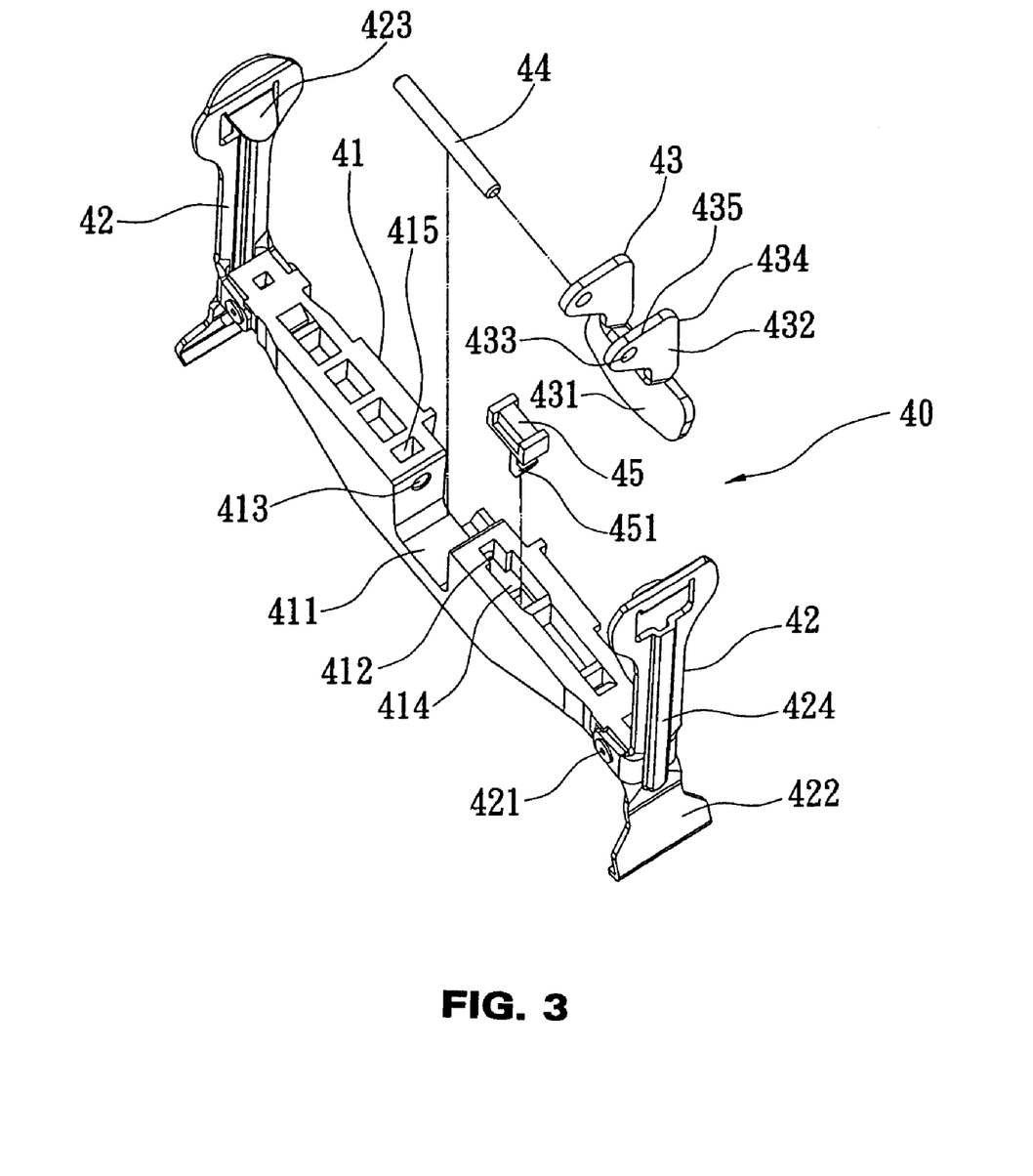
FIG. 3 is an exploded view of the clamping structure of the present invention.
Figure 4:
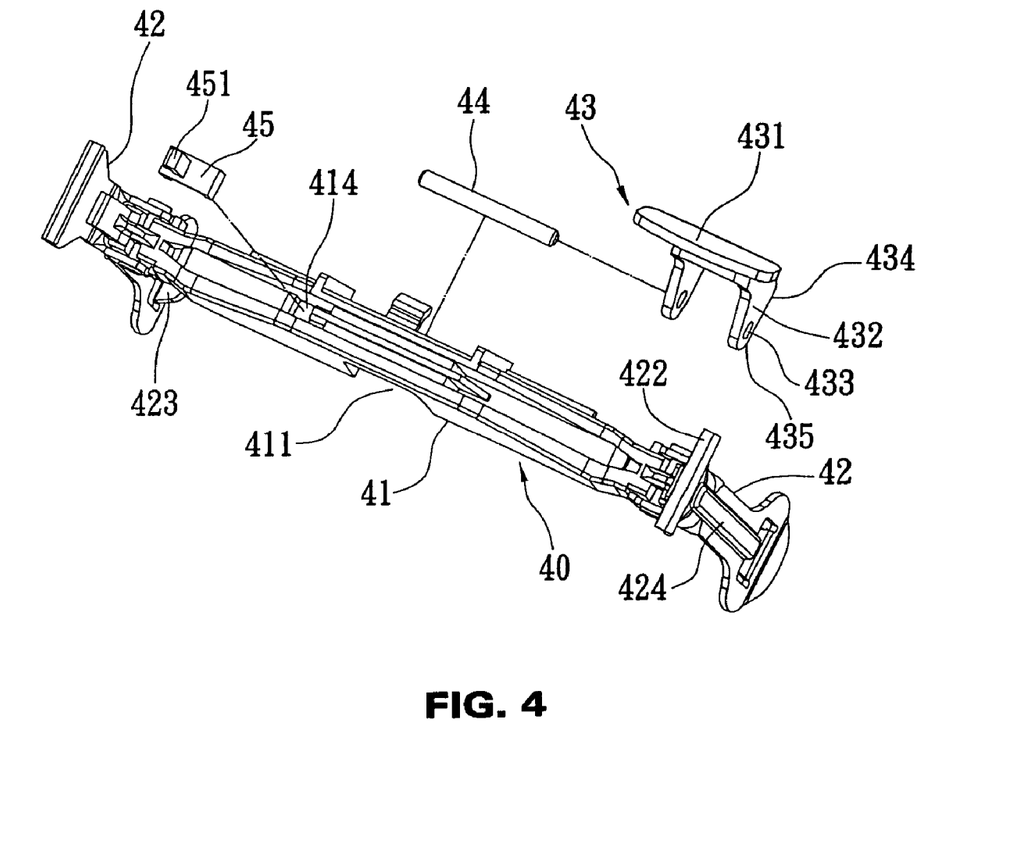
FIG. 4 is another exploded view of clamping structure of the present invention.
Figure 5:
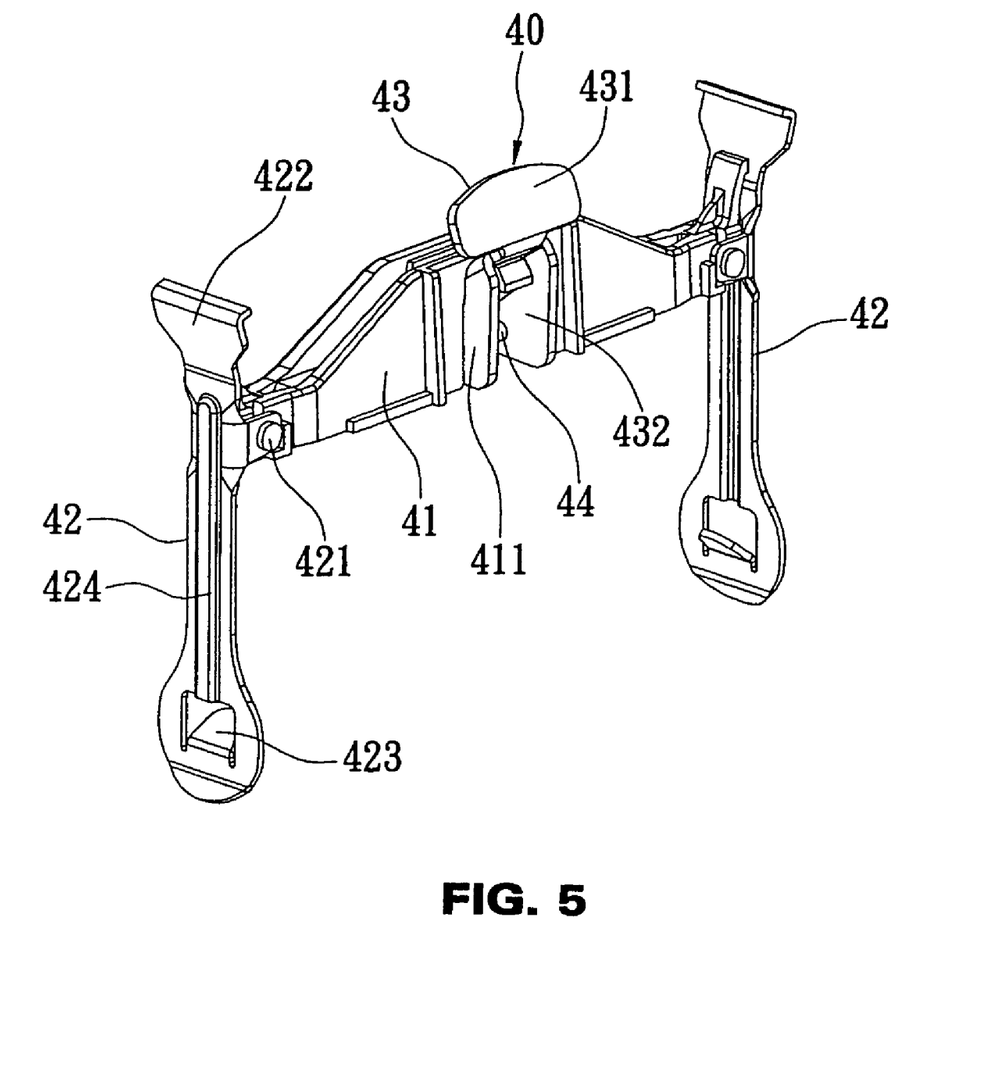
FIG. 5 is a perspective view of the clamping structure of the present invention.
Figure 6:
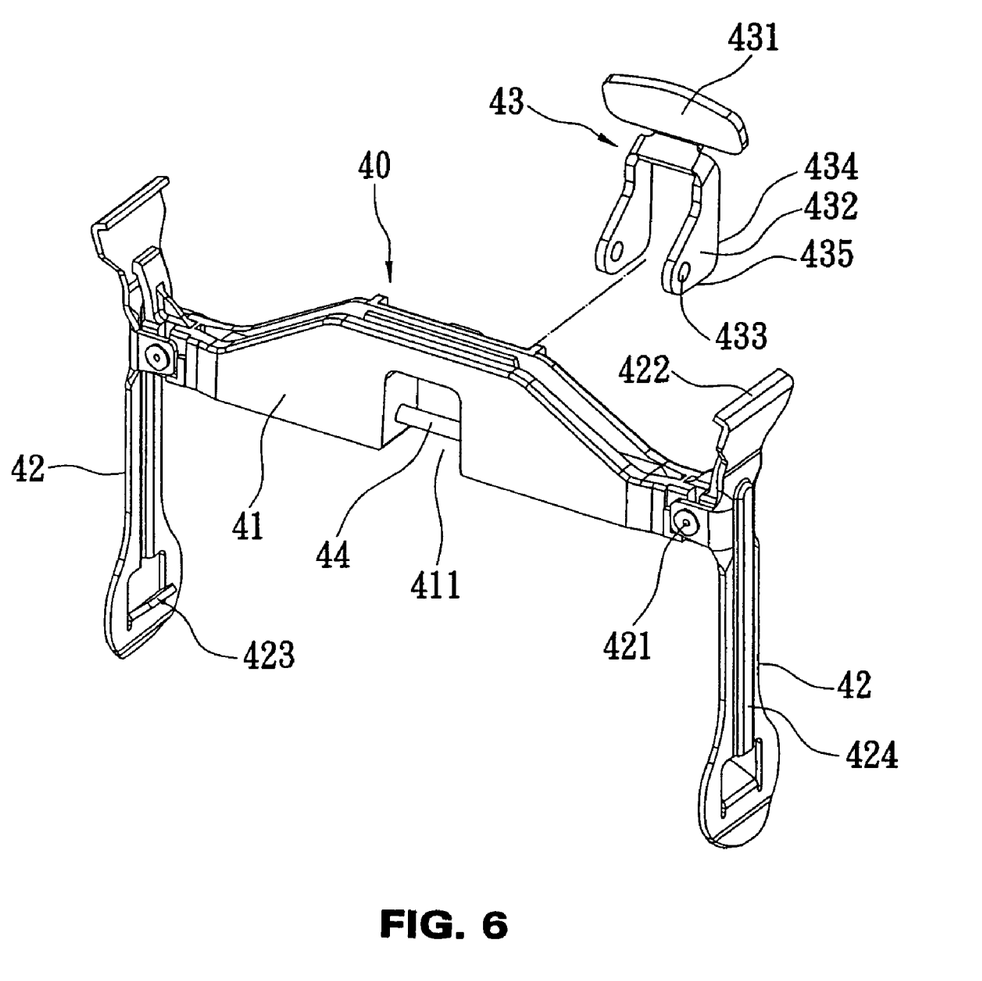
FIG. 6 is a perspective view of the clamping structure of the present invention (the pivot element is separated from the clamping structure)

Referring to FIGS. 1 and 2, the prior art provides a heat-dissipating module that comprises a heat-dissipating body 90, a top frame 91, two clamping elements 92, two elastic elements 93 and a bottom frame 94. The heat-dissipating body 90 is made of good heat conductivity material like aluminum or copper. The heat-dissipating body 90 with a bottom side is disposed on the chip module (not shown in drawing) for transmitting the heat generating from the chip module to the heat-dissipating body 90.

The top frame 91 is framed on the heat-dissipating body 90 and has two receiving grooves 95 formed at two opposite sides thereof. The top frame 91 also can connect with a heat-dissipating fan (not shown in drawing) to help to dissipate the heat.

Each of the two clamping elements 92 is composed of a clamping body 96 and two clamping portions 97. The two elastic elements 93 are fixed on the two clamping bodies 96 and received in the two opposite receiving grooves 95, respectively.

The bottom frame 94 is disposed around the chip module (not shown in drawing) and fixed on a printed circuit board (not shown in drawing). Each of the four clamping portions 97 has a hook 98 formed at an end side thereof. The bottom frame 94 has four hook holes 99 formed at four corners and corresponding to four hooks 98. The two clamping elements 92 are fixed correspondingly to two opposite sides of the bottom frames 94 by the four hooks 98 hooking correspondingly to the hook holes 99 for fixing the two elastic elements 93 and the top frame 91. The top frame 91 is pressed on the heat-dissipating body 90 for the bottom side of the heat-dissipating body 90 tightly contacting to the chip module to increases the heat-dissipating effect.

In order to eliminate the spare gap that is formed between the clamping element 92 and the top frame 91, and clamping element 92 and the bottom frame 94, the elastic element 93 must be disposed under the clamping element 92 for firmly positioning the heat-dissipating body 90 between the top frame 91 and the bottom 94.

OBJECT AND SUMMARY OF THE INVENTION

The primary object of the present invention is to provide a clamping structure. The clamping structure has a good rigidity and is used to eliminate a spare gap between the clamping element and the top frame, and clamping element and the bottom frame without using the elastic element for the clamping element firmly hook on the bottom frame and firmly pressing on the top frame as a tight assembly. The heat-dissipating body is tightly contacted to the chip module by the tight assembly, so as to efficiently transmit the heat from the chip module to the heat-dissipating body.

In order to achieve the above objects, the present invention provides a clamping structure used to fix a heat-dissipating body on a chip module, the clamping structure comprising a clamping body, two clamping portions, a pivot element and a top frame.

The two clamping portions are connected to two sides of the clamping body, respectively.

The pivot element is pivotally connected to the clamping body and having a movable portion and an ear piece, the ear piece having a fixed portion and a release portion respectively formed at an end side thereof for fixing and releasing the heat-dissipating body.

The top frame is disposed on the heat-dissipating body, the clamping body disposed on the top frame, and the fixed portion and the release portion selectively contacted to a top portion of the top frame.

Wherein the ear piece is rotated between a first position and a second position by the movable portion, the first position is when the fixed portion contacted to the top portion of the top frame, and the second position is when the release portion contacted to the top portion of the top frame.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Referring to FIGS. 3 to 6, the present invention provides a clamping structure, which comprises a clamping element 40 being made of metal or another material and having a clamping body 41, two clamping portions 42, a pivot element 43, a pivot axle 44 and a block 45. The clamping body 41 is a rectangular body with a good rigidity and has a notch 411 formed at a central portion thereof, two pivot holes 412 and 413 respectively formed at two opposite sides of the notch 411, a receiving groove 414 and a stop wall 415 respectively formed at two external sides of the two pivot holes 412 and communicating to the two pivot holes 412, respectively.

The two clamping portions 42 are rotatably pivoted at two sides of the clamping body 41 by two pivot elements, respectively. Each of two clamping portions 42 has a push portion 422 and a hook portion 423 respectively formed at a top side and a bottom side thereof by pressing. Each of the two clamping portions 42 further has a reinforced rib 424 extended outwardly therefrom and extended along a length thereof for reinforcing the rigidity of the clamping portion 42.

The pivot element 43 has a movable portion 431 and two ear pieces 432 connected to a side of the movable portion 431. Each of the two ear pieces 432 has an axle hole 433, a fixed portion 434 formed at a side thereof and a release portion 435.

The two ear pieces 432 are received in the notch 411. The pivot element 43 is rotatably pivoted to the clamping body 41 by the pivot axle passing through the receiving groove, and the two axle hole 433 and two pivot holes 412, 413. Each of the two ear pieces 432 has a distance between the fixed portion 434 and the axle hole 433 larger than that between the release portion 435 and the axle hole 433. The pivot axle 44 with one side is positioned on the stop wall 415 and another side is positioned on the block 45 (when the block 45 is received in the receiving groove 414) for preventing the pivot element from separating from the two axle holes 433 and two pivot holes 411, 412. The block 45 has a hook portion 451 formed at a side thereof for fixedly hooking the block 45 in a bottom side of the receiving groove 414.

Figure 9:
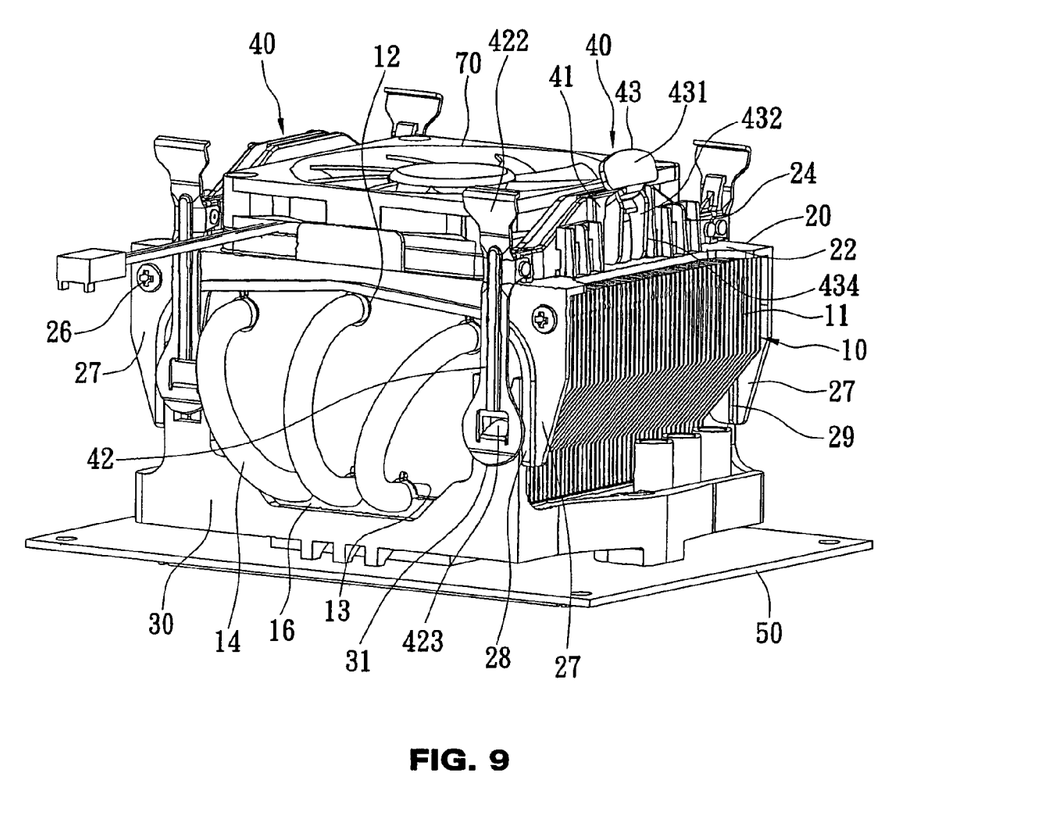
FIG. 9 is a perspective view of the clamping structure used to the heat-dissipating module according to the present invention.
Figure 10:
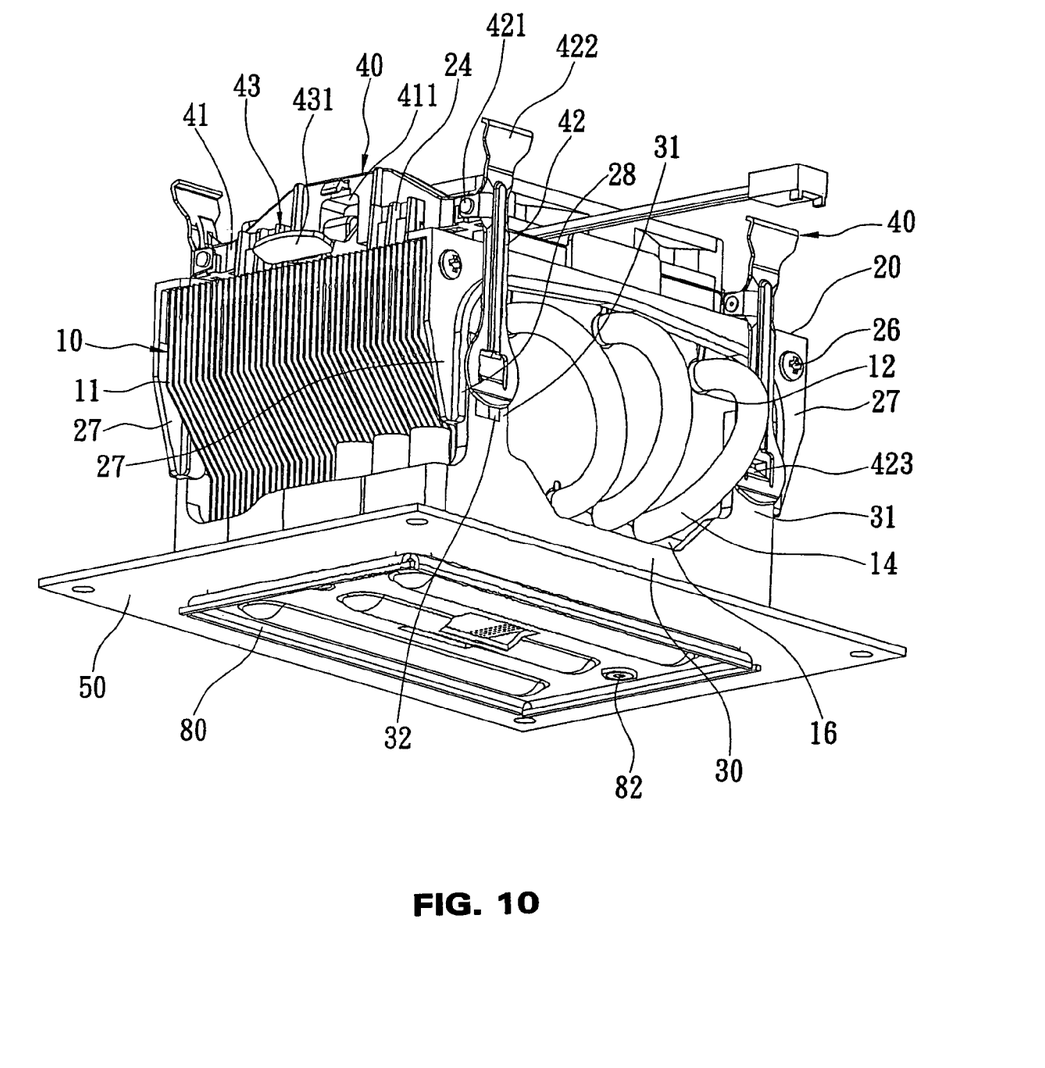
FIG. 10 is another perspective view of the clamping structure used to the heat-dissipating module according to the present invention.

When the ear piece 432 is rotated between a first position and a second position by the movable portion 431, the first position is when the fixed portion 434 contacted to the top portion of the top frame 20 (as shown in FIG. 10), and the second position is when the release portion 435 contacted to the top portion of the top frame 20 (as shown in FIG. 9).

Referring to FIGS. 7 to 10, the present invention is used with a heat-dissipating module. The heat-dissipating module comprises a heat-dissipating body 10, a top frame 20 and a bottom frame 30. The heat-dissipating body 10 is hooked on the chip module 60 by the two hook elements 40, is made of a good conductivity material like aluminum and copper, has a plurality of heat-dissipating fins 11 for increasing the heat-dissipating area, and may be an aluminum extrusion, a die-casting, a die-stacked or some other type of heat-dissipating body.

Figure 7:
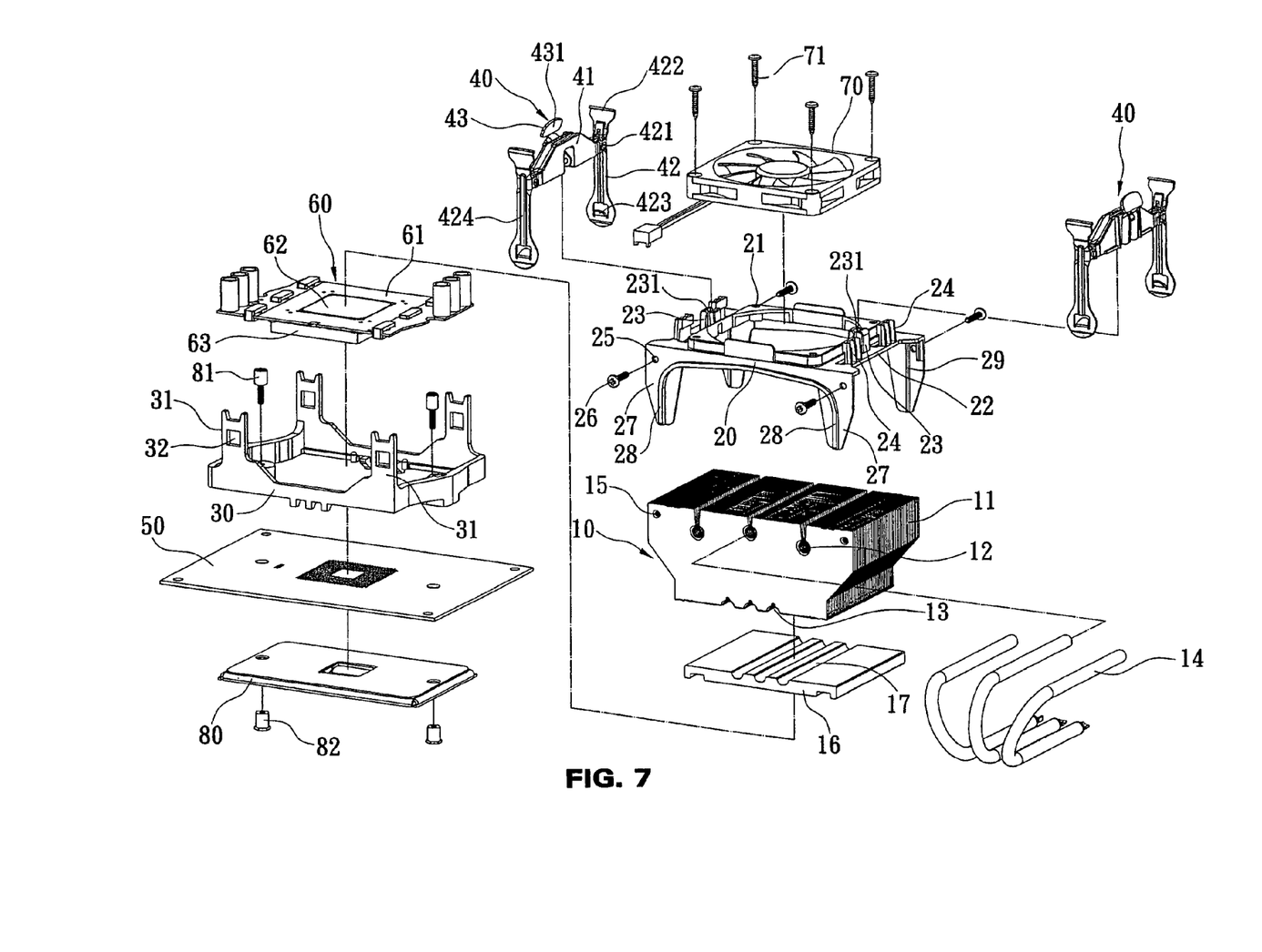
FIG. 7 is an exploded view of the clamping structure used to the heat-dissipating module according to the present invention.
Figure 8:
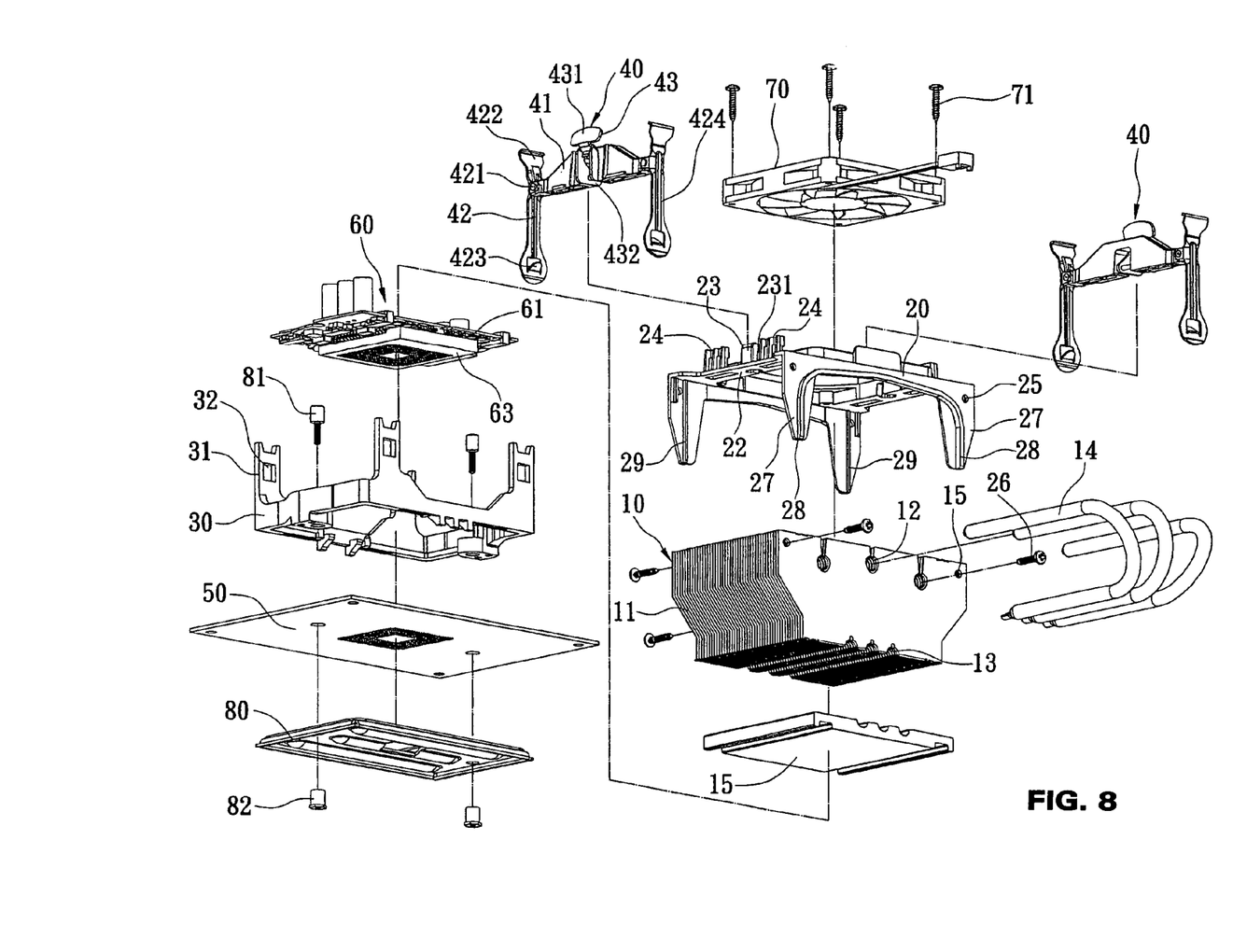
FIG. 8 is another exploded view of the clamping structure used to the heat-dissipating module according to the present invention.

Each of the heat sink 11 has a through hole 12 disposed near a top side thereof and a concave groove 13 disposed near a bottom side thereof. The through hole 12 and the concave groove 13 are used to receive a heat pipe 14 for increasing the transmission velocity of heat from the bottom side of the heat sink 11 to the top side of the heat sink 11. The heat-dissipating body 10 has two fixed holes 15 disposed at two opposite sides thereof for mating with the top frame 20.

The heat-dissipating body 10 is disposed on the chip module 60. The chip module 60 is disposed on a motherboard 50. The chip module is composed of a printed circuit board 61, a heat-generating chip 62 disposed on the printed circuit board 61 and a connector 63 electrically connected to the motherboard 50.

The bottom side of the heat-dissipating body 10 is contacting to a top side of the heat-generating chip 62 for transmitting the heat from the heat-dissipating chip 62 to the heat-dissipating body 10.

The heat-dissipating module further comprises a heat-dissipating plate 16 disposed between the heat-dissipating body 10 and the chip module 60. The heat-dissipating plate 16 is made of a good heat conductivity material like aluminum or copper, makes contact with the bottom side of the heat-dissipating body 10 at a top side thereof and makes contact with the top side of the heat-generating chip 62 at a bottom side thereof. The heat-dissipating plate 16 has a plurality of concave grooves 17 corresponding to the concave grooves 13 of the heat sink 11 for transmitting the heat from the heat-generating chip 62 to the heat-dissipating body 10 through the heat-dissipating plate 16.

The top frame 20 is a rectangular frame used to frame the top side of the heat-dissipating body 10. The top frame 20 has four connected holes 21 formed at a top side thereof for connecting a fan 70 on the top frame 20 by four screws 71.

The top frame 20 has two planar shoulder portions 22 extended from two opposite sides thereof. Each of the two shoulder portions has a pivot seat 23 and two limited posts 24 projected from the shoulder portion 22. The pivot seat 23 has a slot 231 formed thereon. The top frame 20 has four fixed holes 25 formed at four corners thereof and corresponding to four fixed holes 15 of the heat-dissipating body 10. The top frame 20 is assembled on the heat-dissipating body 10 by four screws 26 penetrating through the fixed holes 15 and 25. The top frame 20 has four supports 27 extended downward from the four corners thereof for clamping a top half portion of the heat-dissipating body 10. Each of the supports 27 has a guiding rib 28 projected from an external wall thereof. Every two guiding rib 28 of four guiding ribs 28 is connected to each other. Each of the supports 27 has a reinforce rib 29 projected from an internal wall thereof.

The bottom frame 30 is similar to a rectangular frame, frames the heat-dissipating body 10 and the chip module 60, and is fixed on the printed circuit board 50 by a back plate 80 with a plurality of screws 81 and nuts 82. The bottom frame 30 has four supports 31 extended upwardly from the four corners thereof for clamping a bottom half portion of the heat-dissipating body 10. Each of the four supports 31 has a hook hole 32.

Referring to FIGS. 9 and 10, two supports 31 are positioned between every two guiding ribs 28. In other words, each of the four supports 31 with an external side is slidly contacted with an internal side of each of the four guiding ribs 28, so the top frame 20 and the bottom frame 30 assembled to each other for preventing the top frame 20 and the bottom frame 30 from abnormally separating.

The two clamping bodies 41 are disposed on the corresponding two shoulder portions 22. The two pivot axles 44 are received in the corresponding two slots 231 of two pivot seats 23. The limited post 24 is used to contact an external side 41a of the clamping body 41 for firmly fixing the clamping body 41 on the shoulder portion 22.

First, the two clamping bodies 41 are disposed on the corresponding two shoulder portions 22. Second, the four hooks 423 of the two clamping elements 40 are clamped to the corresponding four hook holes 32 of the four supports 31 of the bottom frame 30 for fixing the two clamping elements 40 on the corresponding two sides of the bottom frame 30 (shown as FIG. 9). The fixed portion 434 and the release portion 435 are selectively contacted to the top portion of the shoulder portion 22 of the top frame 20 for fixing or releasing the heat-dissipating body 10. Whereby, the heat-dissipating body 10 is positioned between the top frame 20 and the bottom frame 30, and the chip module 60 is positioned between the heat-dissipating body 10 and the bottom frame 30.

When the two movable portions 431 of the two pivot elements 43 of the two clamping elements 40 are moved outwardly, the two top portions of the two shoulder portions 22 are contacted with the two fixed portions 434 for firmly clamping the heat-dissipating body 10 and chip module 60 between the top frame 20 and the bottom frame 30.

While a preferred embodiment of the present invention is shown and described, it is envisioned that those skilled in the art may devise various modifications of the present invention without departing from the spirit and scope of the appended claims.

What is claimed is:

1. A clamping structure used to fix a heat-dissipating body on a chip module, comprising:
   a clamping body;
   two clamping portions connected to two sides of the clamping body, each clamping portion having a hook portion pivoted at two sides of the clamping body by a pivot element, respectively;
   a pivot element pivotally connected to the clamping body and having a movable portion and an ear piece, the ear piece having a fixed portion and a release portion respectively formed at an end side thereof for fixing and releasing the heat-dissipating body; and
   a top frame disposed on the heat-dissipating body, the clamping body disposed on the top frame, and the fixed portion and the release portion selectively contacted to a top portion of the top frame;
   wherein the ear piece is rotated between a first position and a second position by the movable portion, the first position is when the fixed portion contacted to the top portion of the top frame, and the second position is when the release portion contacted to the top portion of the top frame.

2. The clamping structure as claimed in claim 1, wherein the pivot element has a axle hole for pivotally connecting to the clamping body, and the ear piece having a distance between the fixed portion and the axle hole larger than that between the release portion and the axle hole.

3. The clamping structure as claimed in claim 1, wherein the clamping body has a notch formed at a central portion thereof, two pivot holes respectively formed at two opposite sides of the notch, a receiving space and a stop wall respectively formed at two outsides of the two pivot holes, a pivot axle disposed through the axle hole and two pivot holes for pivoting the pivot element in the notch and having one side contacted to the stop wall for fixed position, and a block received in the receiving space, another side of the pivot axle contacted to the block for fixed position.

4. The clamping structure as claimed in claim 1, wherein the top frame has two shoulder portions respectively extended from two opposite sides thereof, each of two shoulder portions having an axle seat and a limited post, the axle seat having a slot, the clamping body disposed on the shoulder portion, the pivot axle received in the slot, the limited post contacted to an external wall of the clamping body for positioning the clamping body on the shoulder portion.

5. The clamping structure as claimed in claim 1, wherein each of the two hook portions has a push portion and a hook respectively formed at a bottom side and a top side thereof, the hook projected inwardly from the hook portion, the clamping structure further comprising a bottom frame disposed under the heat-dissipating body, the bottom frame having four supports formed at four corners thereof, each of the four supports having a hook hole formed at a side thereof, and the hooks of the hook portions clamping to the hook holes of the bottom frame, respectively.

6. The clamping structure as claimed in claim 1, wherein each of the two hook portions has a reinforced rib.

7. A heat-dissipating module, comprising:
   a heat sink; and
   a clamping element, the clamping element comprising:
   a clamping body;
   two clamping portions connected to two sides of the clamping body, each clamping portion having a hook portion pivoted at two sides of the clamping body by a pivot element, respectively;
   a pivot element pivotally connected to the clamping body and having a movable portion and an ear piece, the ear piece having a fixed portion and a release portion respectively formed at an end side thereof for fixing and releasing the heat-dissipating body; and
   a top frame disposed on a heat-dissipating body, the clamping body disposed on the top frame, and the fixed portion and the release portion selectively contacted to a top portion of the top frame;
   wherein the ear piece is rotated between a first position and a second position by the movable portion, the first position is when the fixed portion contacted to the top portion of the top frame, and the second position is when the release portion contacted to the top portion of the top frame.

8. The heat-dissipating module as claimed in claim 7, wherein the pivot element has a axle hole for pivotally connecting to the clamping body, and the ear piece having a distance between the fixed portion and the axle hole larger than that between the release portion and the axle hole.

9. The heat-dissipating module as claimed in claim 7, wherein the clamping body has a notch formed at a central portion thereof, two pivot holes respectively formed at two opposite sides of the notch, a receiving space and a stop wall respectively formed at two outsides of the two pivot holes, a pivot axle disposed through the axle hole and two pivot holes for pivoting the pivot element in the notch and having one side contacted to the stop wall for fixed position, and a block received in the receiving space, another side of the pivot axle contacted to the block for fixed position.

10. The heat-dissipating module as claimed in claim 7, wherein the top frame has two shoulder portions respectively extended from two opposite sides thereof, each of two shoulder portions having an axle seat and a limited post, the axle seat having a slot, the clamping body disposed on the shoulder portion, the pivot axle received in the slot, the limited post contacted to an external wall of the clamping body for positioning the clamping body on the shoulder portion.

11. The heat-dissipating module as claimed in claim 7, wherein each of the two hook portions has a push portion and a hook respectively formed at a bottom side and a top side thereof, the hook projected inwardly from the hook portion, the clamping structure further comprising a bottom frame disposed under the heat-dissipating body, the bottom frame having four supports formed at four corners thereof, each of the four supports having a hook hole formed at a side thereof, and the hooks of the hook portions clamping to the hook holes of the bottom frame, respectively.

12. The heat-dissipating module as claimed in claim 7, wherein each of the two hook portions has a reinforced rib.

* * * * *